United States Patent
Burton et al.

(10) Patent No.: US 6,858,522 B1
(45) Date of Patent: Feb. 22, 2005

(54) ELECTRICAL CONTACT FOR COMPOUND SEMICONDUCTOR DEVICE AND METHOD FOR FORMING SAME

(75) Inventors: Richard S. Burton, Newbury Park, CA (US); Kyushik Hong, Thousand Oaks, CA (US); Philip C. Canfield, Thousand Oaks, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/675,023

(22) Filed: Sep. 28, 2000

(51) Int. Cl.⁷ ............................................. H01L 21/28
(52) U.S. Cl. ..................... 438/571; 438/573; 438/582
(58) Field of Search ............................. 438/167, 172, 438/571, 573, 582; 257/745, 755, 757, 769

(56) References Cited

U.S. PATENT DOCUMENTS

| | | | |
|---|---|---|---|
| 4,796,082 A | * 1/1989 | Murakami et al. | 357/71 |
| 5,523,623 A | * 6/1996 | Yanagihara et al. | 257/745 |
| 5,583,355 A | * 12/1996 | Bernhardt et al. | 257/280 |
| 5,747,878 A | * 5/1998 | Murakami et al. | 257/745 |
| 5,982,036 A | * 11/1999 | Uchibori et al. | 257/757 |
| 6,049,114 A | * 4/2000 | Maiti et al. | 257/412 |
| 6,169,297 B1 | * 1/2001 | Jang et al. | 257/99 |
| 6,188,137 B1 | * 2/2001 | Yagura et al. | 257/769 |
| 6,255,679 B1 | * 7/2001 | Akiba | 257/284 |
| 6,573,599 B1 | * 6/2003 | Burton et al. | 257/745 |

OTHER PUBLICATIONS

Murakami, M. et al, *Thermally stable, low–resistance NiInW ohmic contacts to n–type GaAs*, Appl. Phys. Lett. 51 (9), Aug. 31, 1987, pp. 664–666.

Piotrowska, A. et al, *Ohmic Contacts to III–V Compound Semiconductors: A Review of Fabrication Techniques*, pp. 179–197. Solid State Electronics, Jan. 12, 1982.

Yoder, M., *Ohmic Contacts in GaAs*, Solid–State Electronics, vol. 23, May 30, 1979, pp. 117–119.

Tanahashi, K. et al, *Thermally stable non–gold Ohmic contacts to n–type GaAs. I. NiGe contact metal*, Appl. Phys. Lett. 72 (9), Nov. 1, 1992, pp. 4183–4190.

(List continued on next page.)

*Primary Examiner*—Hsien-Ming Lee
(74) *Attorney, Agent, or Firm*—Thomas, Kayden, Horstmeyer & Risley, LLP

(57) ABSTRACT

A method of manufacturing a semiconductor device having an improved ohmic contact system to epitaxially grown, low bandgap compound semiconductors. In an exemplary embodiment, the improved ohmic contact system comprises a thin reactive layer of nickel deposited on a portion of an epitaxially grown N+ doped InGaAs emitter cap layer. The improved ohmic contact system further comprises a thick refractory layer of titanium or other suitable material deposited on the thin reactive layer. Both the reactive layer and the refractory layer are substantially free of gold and other low resistivity, high conductivity metal overlayers. The improved ohmic contact system and method for forming the same minimize contact resistance, improve reliability and the long-term stability of the electrical characteristics of the device, minimize raw material costs, and decrease manufacturing costs on high performance semiconductor devices, such as heterojunction bipolar transistors, laser diodes, light emitting diodes (LEDs), Schottky diodes, field effect transistors (FETs), metal-semiconductor field effect transistors (MESFETs), metal-oxide-semiconductor field effect transistors (MOSFETs), high electron mobility transistors (HEMTs), and other compound semiconductor and optoelectronic devices.

20 Claims, 5 Drawing Sheets

OTHER PUBLICATIONS

Murakami, M. et al., *Thermally stable, low resistance Ohmic contacts to n–type GaAs*, Proc. of Gallium Arsenide and related components, 1987.

Murakami, M. et al, *Thermally stable ohmic contacts to n–type GaAs: II. MoGeinW contact metal*, J. Appl. Phys., Oct. 1987.

Murakami, M. et al, *Thermally stable ohmic contacts to n–type GaAs. v. Metal–semiconductor field–effect transistors with NiInW ohmic contacts*, J. Appl. Phys. 65 (9), May 1, 1989, pp. 3546–3551.

Hugon, M. et al, *Highly stable sputtered NiInW refractory ohmic contact to n–type GaAs*, J. Appl. Phys. 72 (8) Oct. 15, 1992, pp. 3570–3577.

Oku, T. et al, *NiGe–based ohmic contacts to ntype GaAs. I. Effects of in addition*, J. Appl. Phys. 75 (5), Mar. 1, 1994, pp. 2522–2529.

Shih, Y. et al, *Thermally stable ohmic contacts to n–type GaAs. IV. Role of Ni on NiInW contacts*, J. Appl. Phys. 65 (9), May 1, 1989, pp. 3539–3545.

Jan, C., et al, *Alloying of Ni/In/n–GaAs ohmic contacts induced by Ga–Ni–As ternary eutectic reactions*, J. Appl. Phys. 68 (12), Dec. 15, 1990, pp. 6458–6462.

* cited by examiner

ELECTRICAL CONTACT FOR COMPOUND SEMICONDUCTOR DEVICE AND METHOD FOR FORMING SAME

FIELD OF INVENTION

This invention relates generally to semiconductor devices. More particularly, the present invention relates to an improved electrical contact system for compound semiconductor devices, such as gallium arsenide (GaAs) devices, and a method of forming the same.

BACKGROUND OF THE INVENTION

Semiconductor integrated circuits include a plurality of microelectronic structures (e.g., transistors, diodes, and the like) formed by creating a variety of doped regions in a semiconductor wafer substrate. These regions are formed by performing a number of operations, for example, epitaxial growth, diffusion, ion implantation, etching, and the like. These devices are then interconnected by a conductive metallization layer to form a desired integrated circuit.

This invention concerns semiconductor devices that are manufactured by using a multilayer structure formed through the epitaxy of semiconductor materials of different properties and that are useful as ultrahigh frequency and ultrahigh-speed transistors. For example, applications of the present invention may be found in connection with N+contacts to laser diodes, heterojunction bipolar transistors (HBTs), light emitting diodes (LEDs), Schottky diodes, field effect transistors (FETs), metal-semiconductor field effect transistors (MESFETs), metal-oxide-semiconductor field effect transistors (MOSFETs), high electron mobility transistors (HEMTs), and other compound semiconductor and optoelectronic devices. For purposes of illustration only, and without limitation, the present invention will be described with particular reference to its application to the manufacture of gallium arsenide (GaAs)-based HBTs having one or more layers of indium gallium arsenide (InGaAs).

In recent years, high performance HBTs have been attracting much attention for power amplifier and high-speed digital applications, including such areas as automotive radar, traffic control, and wireless applications. The general structure of and conventional fabrication processes for HBTs are well known by those skilled in the art.

HBTs are generally made up of collector, base, and emitter layers disposed to form a pair of junctions. In general, an HBT is a three-terminal device in which the upper layers (i.e., the base and emitter layers) are etched away in order to expose the underlying collector layer. Contacts are made to each of the layers to provide the three-terminal device having a collector, emitter, and a base contact.

The reliability of HBTs is directly related to the integrity of the ohmic contacts at the emitter, base, and collector layers. In particular, fabrication of contacts with excellent ohmic characteristics, namely, low contact resistance and low sheet resistance, is critical to achieving high-performance HBT integrated circuits. Primary considerations in the choice of an ohmic metallization system are low specific contact resistance, thermal stability, good morphology, good adhesion to and very shallow penetration of the contact layer into the semiconductor, and resistance to wet chemical processing. The selected metallization system for the ohmic contacts must provide the correct electrical link between the active region of the semiconductor device and the external circuit, while at the same time enabling a low-energy carrier transport through the thin interface region and ensuring a negligible series resistance in it under normal device operating conditions.

In addition, as is common in the art, the deposited ohmic contacts often are alloyed under relatively high-temperature conditions in order to drive the required metal-semiconductor interfacial reaction, or may experience high-temperature thermal cycles as may be required by subsequent processing steps in forming the integrated circuit. High-temperature alloy processes and/or thermal cycles may result in the formation of undesirable alloy "spikes" in the interfacial region of the ohmic contact and the underlying semiconductor layer. These spikes in the interfacial layers can lead to non-uniform current flow through the device and degraded microstructure. Thus, another consideration in the design of an ohmic contact system is the composition and thickness of the reactive layer of the contact system. Preferably, the reactive layer will be fashioned such that substantially all of the metal in the reactive layer reacts with the underlying semiconductor layer during the anneal process, without resulting in excessive alloy spikes or spikes that extend too far into the underlying semiconductor layer and ultimately punch through the semiconductor layer into the underlying layers of the device.

Further disadvantages of prior art fabrication techniques for ohmic contacts to GaAs-based HBTs include utilization of precious metals, such as gold and platinum, which increase raw material costs. Additionally, as the number of metallization layers deposited to form the ohmic contact structure increases, the cost of manufacturing the EBT device increases.

A method of forming contacts on GaAs-based HBTs is thus needed that minimizes contact resistance, prevents punchthrough of reactive contact metallization, reduces raw material costs by eliminating and/or minimizing the use of precious metals such as gold and platinum, and facilitates manufacturing by reducing the number of metallization layers in the contact structure, without sacrificing device performance and functionality. In particular, there exists a need in the art for a suitable ohmic contact to epitaxially grown compound semiconductor materials, such as epitaxially grown, highly N-type doped indium gallium arsenide (InGaAs) and indium arsenide (InAs), that exhibits low sheet resistance and that excludes gold or other highly conductive metal overlayers that have proven detrimental to the reliability and manufacturability of HBT devices of the prior art.

SUMMARY OF THE INVENTION

The present invention relates to a contact system for compound semiconductor devices, such as gallium arsenide (GaAs) devices, and a method of forming the same. In particular, one embodiment of the present invention relates to an improved contact system and method useful in the fabrication of an ohmic contact to a layer of epitaxially grown, low bandgap compound semiconductor material on a semiconductor device such as a HBT.

The present invention meets the aforesaid needs and solves the problem of high contact resistance ohmic contacts by providing a high performance, low contact resistance contact system. In accordance with one embodiment of the present invention, a thin "reactive" layer of nickel or other suitable metal that alloys with and makes good ohmic contact with an underlying epitaxially grown compound semiconductor cap layer is deposited on the emitter cap layer of a HBT. On this reactive layer, a second layer of refractory metal or metal nitride is deposited, which serves as a current spreading layer. No additional overlayers of conductive metal are necessary to form the contact system in accordance with a preferred embodiment of the present invention.

The thickness of the reactive layer of the emitter contact is minimized such that: i) the amount of material deposited to form the reactive layer is sufficient to create low contact resistance at the interface of the reactive layer and the compound semiconductor layer; and ii) the reactive layer is substantially completely consumed during post-deposition high-temperature alloy reactions.

In accordance with a further aspect of the present invention, increased thickness of the refractory layer metallization improves (i.e., decreases) emitter contact sheet resistance, which enables the device to meet or exceed the performance specifications of the prior art while resolving prior art quality and manufacturing deficiencies.

These and other aspects, features, embodiments and advantages of the present invention will be better understood by studying the detailed description in conjunction with the drawings and the accompanying claims.

BRIEF DESCRIPTION OF THE DRAWINGS

A detailed description of embodiments of the invention will be made with reference to the accompanying drawings, wherein like numerals designate corresponding parts in the several Figures, and wherein.

DETAILED DESCRIPTION OF THE DRAWINGS

As those skilled in the art are aware, a variety of techniques currently exist for the fabrication of HBTs into which the method of forming an ohmic contact provided by the present invention may be incorporated. For purposes of illustration only, and without limitation, the present invention will be described with particular reference to a method of fabricating an emitter contact on an epitaxially grown, highly N-type doped InGaAs cap layer on an otherwise conventional GaAs-based HBT device.

Figure 1:
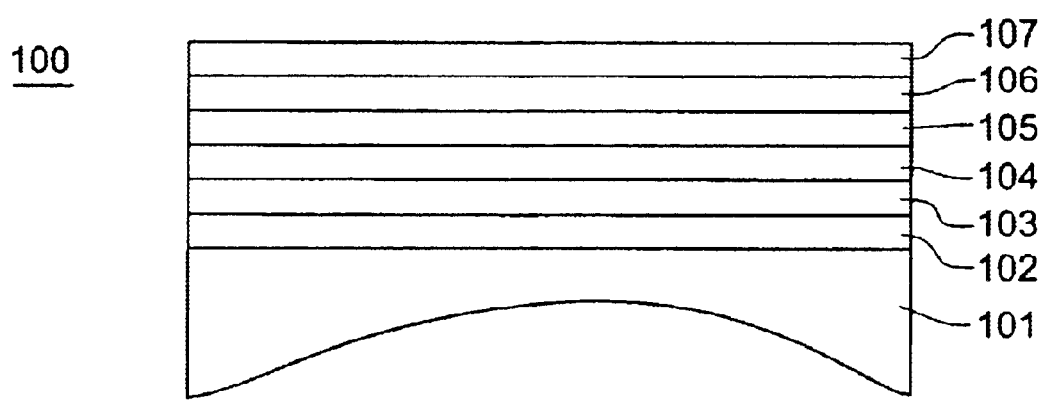
FIGS. 1 through 5 illustrate, in cross-sectional view, a process for forming an ohmic contact on an epitaxially grown, low bandgap compound semiconductor layer of a HBT in accordance with one embodiment of the present invention.

A layer stack for an exemplary HBT device 100 is illustrated in FIG. 1. In FIG. 1, an epitaxially grown, low bandgap compound semiconductor cap layer 107, a cap contact layer 106, an emitter layer 105, a base layer 104, a collector layer 103, and a subcollector layer 102 are formed on a semi-insulating compound semiconductor substrate 101. One skilled in the art will appreciate that the desired characteristics of these layers may be specified and the materials tailored to any number of specific device and/or circuit applications. For example, cap layer 107 may be formed from any low bandgap compound semiconductor material, such as, for example, indium gallium arsenide ($In_xGa_{1-x}As$, 0<x<1), InAs, indium gallium phosphide ($In_xGa_{1-x}P$, 0<x<1), indium phosphide (InP), indium aluminum arsenide ($In_xAl_{1-x}As$, 0<x<1), indium gallium arsenic phosphide (InGaAsP), gallium antimonide (GaSb), indium gallium antimonide ($In_xGa_{1-x}Sb$, 0<x<1), and others known to those skilled in the art. Preferably, cap layer 107 is formed from a low bandgap compound semiconductor containing indium, such as $In_xGa_{1-x}As$ wherein 0.05<x<1; $In_xGa_{1-x}As$, wherein 0.3<x<0.8; or InAs. Most preferably, cap layer 107 is formed of epitaxially grown $In_xGa_{1-x}As$, wherein x is approximately 0.6. In one embodiment of the invention, cap layer 107 is epitaxially grown, heavily N-type doped InGaAs. In accordance with this embodiment, cap contact layer 106 may comprise N+ GaAs, emitter layer 105 may comprise N-type InGaP or aluminum gallium arsenide (AlGaAs), base layer 104 may comprise P+ GaAs, collector layer 103 may comprise N— GaAs, subcollector layer 102 may comprise N+GaAs, and substrate 101 may be a semi-insulating GaAs wafer.

Figure 2:
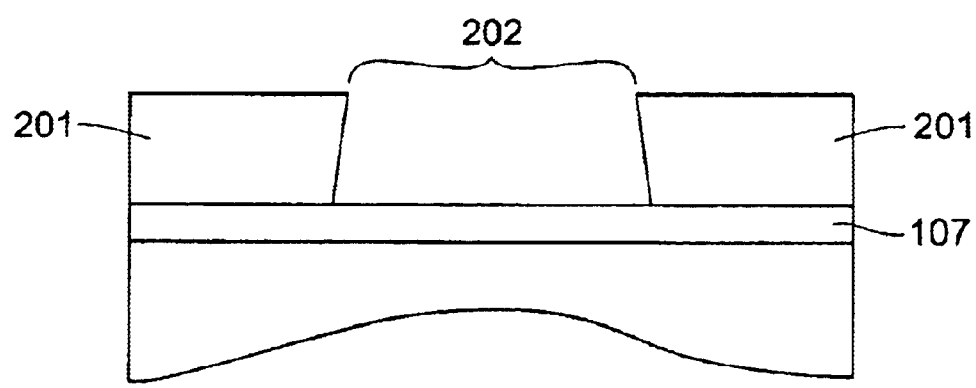

FIGS. 2–5 illustrate schematically a process for forming an ohmic contact to an epitaxially grown, low bandgap compound semiconductor cap layer 107, such as, for example, an epitaxially grown InGaAs cap layer, in accordance with one embodiment of the present invention. As illustrated in FIG. 2, a photoresist masking material 201 is first deposited on cap layer 107 and patterned using, for example, standard photolithographic techniques to provide a contact region 200. Contact region 200 extends to the exposed surface of cap layer 107.

Figure 3:
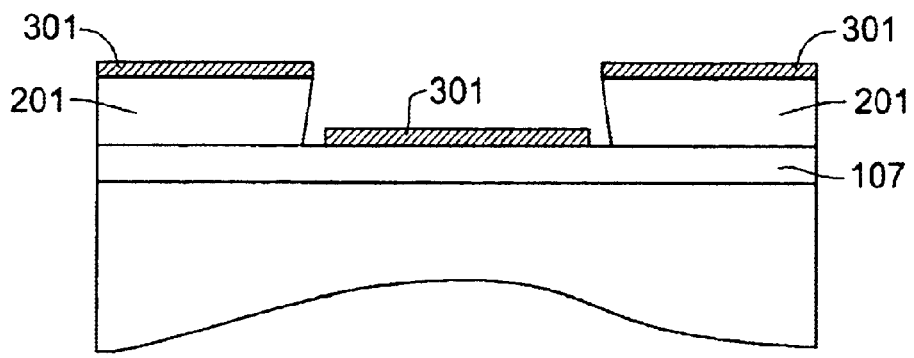

In FIG. 3, a reactive layer 301 comprising the first component of the desired metallization system for the ohmic contact to cap layer 107 may be deposited by standard techniques onto device 100 such that it adheres to surfaces of photoresist 201 and to the exposed portion of cap layer 107. The use of platinum, palladium, nickel, ruthenium, vanadium, and cobalt metals or mixtures or composites of these metals for this application is well known in the art. In one embodiment of the present invention, reactive layer 301 metallization may be platinum, palladium, nickel, ruthenium, cobalt or any similar metal that reacts with gallium arsenide to form a suitable interfacial layer. Preferably, reactive layer 301 metallization comprises nickel.

The thickness of reactive layer 301 is minimized such that the amount of material deposited to form the reactive layer is sufficient to create low contact resistance at the interface of reactive layer 301 and cap layer 107. In accordance with one embodiment of the present invention, the amount of nickel deposited on cap layer 107 to form the ohmic contact is optimized such that the deposited nickel reacts with the cap layer 107 and the resultant alloy interfacial layer (not shown) reaches equilibrium during manufacture. If equilibrium is reached, the potential for further chemical reaction between the nickel metal and the compound semiconductor material of cap layer 107 is substantially or completely eliminated and "punchthrough" caused by reactive diffusion is minimized. In one embodiment of the present invention, reactive layer 301 has a thickness of between about 10 and about 500 angstroms. In one embodiment of the present invention, reactive layer 301 has a thickness of between about 20 and about 100 angstroms. Most preferably, reactive layer 301 has a thickness of about 40 angstroms. In another embodiment, addition of an adhesive element to the nickel is preferred such that an alloy material consisting mostly of nickel and some other adhesive element improves adhesive of layer 301 to underlying layer 107 and any overlying material layers, such as a refractory layer such as that illustrated in FIG. 4. Such an adhesive element may comprise, for example, titanium, silicon, chromium, or other elements or compounds known in the art to improve or promote layer adhesion. The adhesive element, if present in the reactive layer, can comprise up to about 90 atomic percent of the reactive layer material, and preferably comprises from about 5 to about 45 atomic percent of the reactive layer material.

Figure 4:
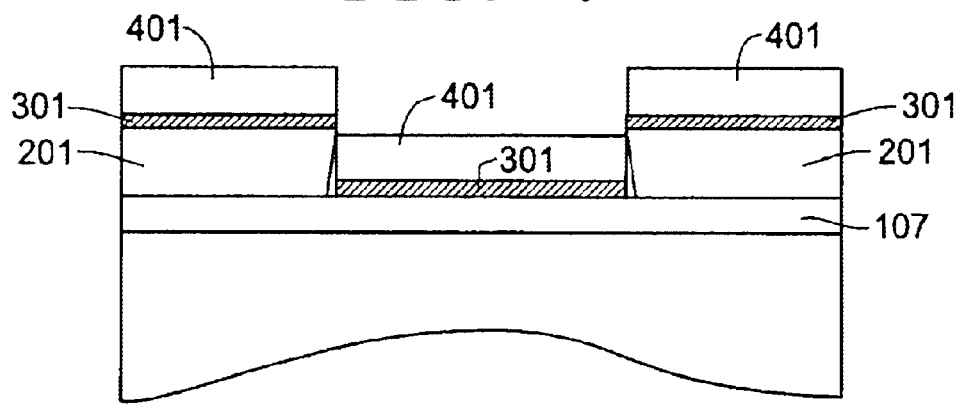

In FIG. 4, a low sheet resistance refractory layer 401 comprising the second component of the desired base contact metallization system may be deposited by standard techniques on reactive layer 301. Refractory layer 401 may be formed of any suitable material exhibiting low reactivity and high conductivity, such that refractory layer 401 becomes an effective current spreading layer on the device and reduces contact sheet resistance. For example, refractory layer 401 may be formed from titanium (Ti), tantalum (Ta), molybdenum (Mo), tungsten (W), TiW, TaN, metal nitrides, metal suicides, metal borides, and other high-conductivity materials known to those skilled in the art. In a preferred embodiment, refractory layer 401 comprises titanium.

In one embodiment, refractory layer 401 has a thickness of at least about 100 angstroms. Preferably, refractory layer 401 has a thickness of about 800 angstroms. The increased thickness of the refractory layer metallization improves (i.e., reduces) contact sheet resistance and eliminates the need for deposition of a low-resistivity, high-conductivity gold overlayer. Prior art techniques typically include depositing a low sheet resistance gold overlayer on the contact system to reduce the sheet resistance of the contact. However, although gold exhibits desirable electrical properties such as low resistivity and high conductivity, it has a tendency of inward diffusion even under moderate temperatures, which can negatively affect the performance characteristics of the electronic device. Alternatively, this low sheet resistance overlayer may comprise any one or more of a variety of different metals and/or materials having such properties of low resistivity and high conductivity in the described application. For ease of discussion, "gold" will be used to represent all metals and/or materials having such desirable electrical properties.

Reactive layer 301 and refractory layer 401 may be deposited using any of a variety of deposition techniques well known in the art, including evaporation, reactive or nonreactive sputtering, chemical vapor deposition, electroplating, electroless plating, or any combination of these techniques. For example, the reactive layer could be deposited by electroplating and the refractory layer could be subsequently deposited by sputtering.

Figure 5:
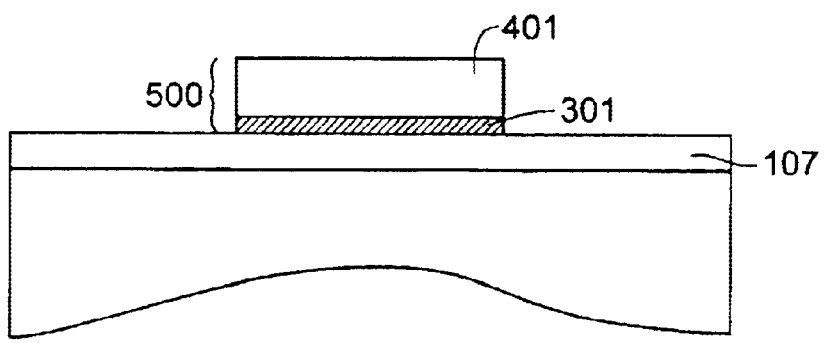

After deposition of low sheet resistance refractory layer 401, photoresist 201 is removed, thereby lifting off the excess metallization deposited thereon and leaving ohmic contact system 500 (FIG. 5) as deposited on cap layer 107. Photoresist 201 removal may be accomplished by a variety of techniques known to those skilled in the art including, for example, by using an appropriate wet chemical solvent, $CO_2$ spray, application of adhesive film to the deposited metal, or the like. With application of an adhesive film, such as a tape, the metal overlying the photoresist is selectively removed when the tape is removed. FIG. 5 illustrates the structure of an ohmic contact system in accordance with one embodiment the present invention comprising a nickel reactive layer 301 and a titanium refractory layer 401. No overlayer metallization comprising gold or other highly conductive material, except in trace amounts, is needed.

A high-temperature alloy step may follow the process illustrated in FIGS. 1–5 or occur after deposition of the base and collector contacts, the processes for which are not herein described, but which are well known to those skilled in the art. A high-temperature alloy step is typically employed to drive the desired collector contact metallization/compound semiconductor interfacial reaction.

Figure 6:
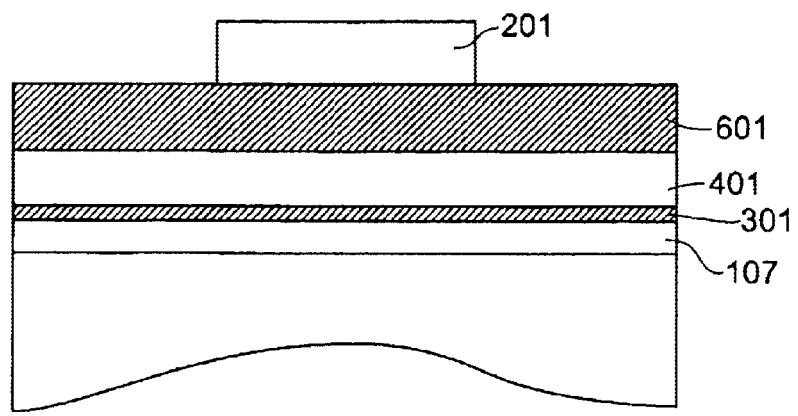
FIGS. 6 through 9 illustrate, in cross-sectional view, a process for forming an ohmic contact on an epitaxially grown, low bandgap compound semiconductor layer of a HBT in accordance with a further embodiment of the present invention.
Figure 7:
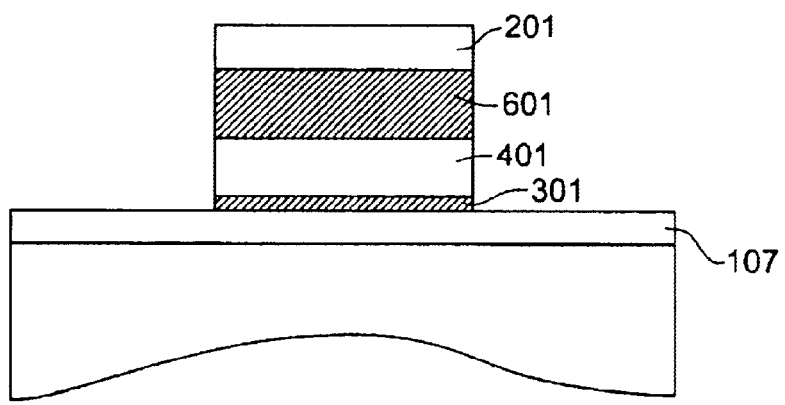
Figure 8:
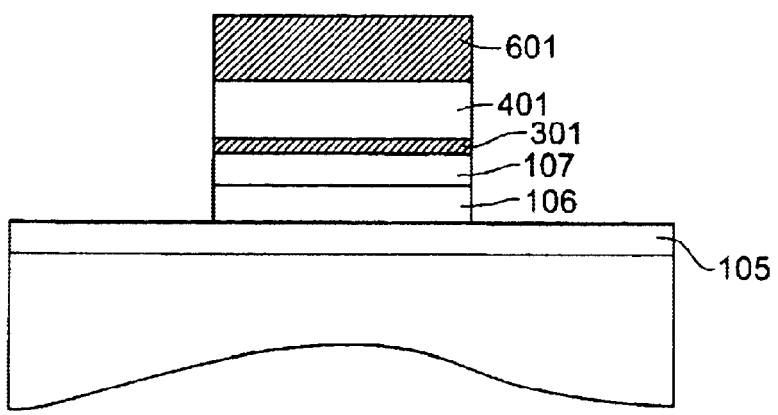

FIGS. 6–9 illustrate further aspects of an embodiment of the present invention. In FIG. 6, reactive layer 301 and refractory layer 401 are formed overlying cap layer 107 in accordance with the above-described processes and parameters. In one embodiment, reactive layer 301 comprises nickel and has a thickness in the range of about 10 to about 500 angstroms, preferably about 20 to about 100 angstroms. Among other choices, the refractory layer 401 may comprise titanium and have a thickness of about 100 angstroms, and most preferably about 800 angstroms. A dielectric layer 601 is formed overlying refractory layer 401. Dielectric layer 601 may be formed of any suitable material exhibiting low conductivity and high resistivity. For example, dielectric layer 601 may be formed from silicon nitride, silicon dioxide, a stack of silicon nitride, silicon dioxide and/or aluminum nitride, or other low conductivity, high resistivity materials known to those skilled in the art. In accordance with one embodiment of the present invention, dielectric layer 601 has a thickness of 500–5000 angstroms. Preferably, dielectric layer 601 has a thickness of about 2000 angstroms. Dielectric layer 601 may be formed using any of a variety of techniques well known in the art, including sputtering, chemical vapor deposition (CVD), plasma-enhanced chemical vapor deposition (PECVD), low pressure chemical vapor deposition (LPCVD), or spin-on processes.

Figure 9:
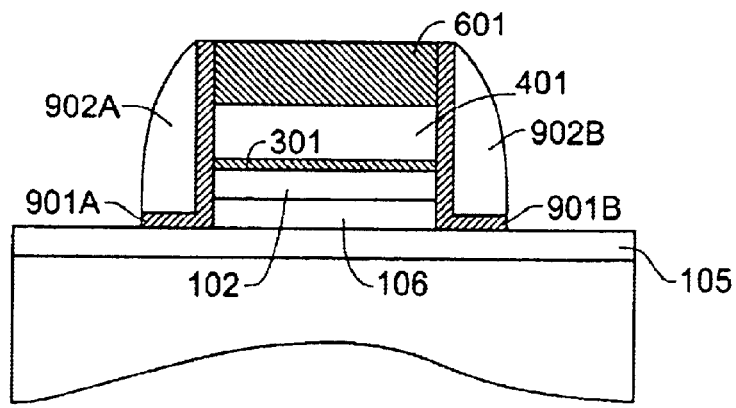

After formation of dielectric layer 601, a layer of photoresist is deposited and patterned in accordance with well-known techniques to form a photoresist layer 201 overlying the desired region of the semiconductor structure that will form the emitter stack. Then, using photoresist layer 201 as a mask, the exposed regions of dielectric layer 601, refractory layer 401, reactive layer 301, cap layer 107 and cap contact layer 106 are etched to reveal the emitter layer 105 (see FIGS. 7–8). Photoresist layer 201 is then removed in accordance with the above-described techniques (see discussion accompanying FIG. 5). In FIG. 9, oxide or nitride spacers 902A, 902B are formed, as may be optional nitride liners 901A, 901B, which serve to further passivate the emitter structure comprising cap contact layer 106, cap layer 107, reactive layer 301, refractory layer 401, and dielectric layer 601. These spacers may be formed by a sequence of deposition and etch process.

Figure 10:
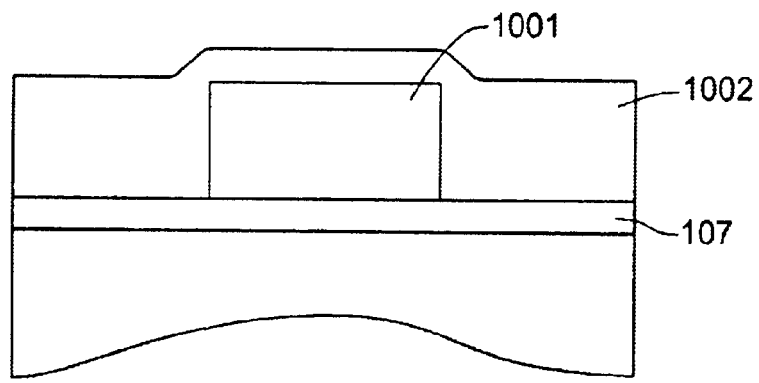
FIGS. 10 through 14 illustrate, in cross-sectional view, a process for forming an ohmic contact on an epitaxially grown, low bandgap compound semiconductor layer of a HBT in accordance with yet another embodiment of the present invention.
Figure 11:
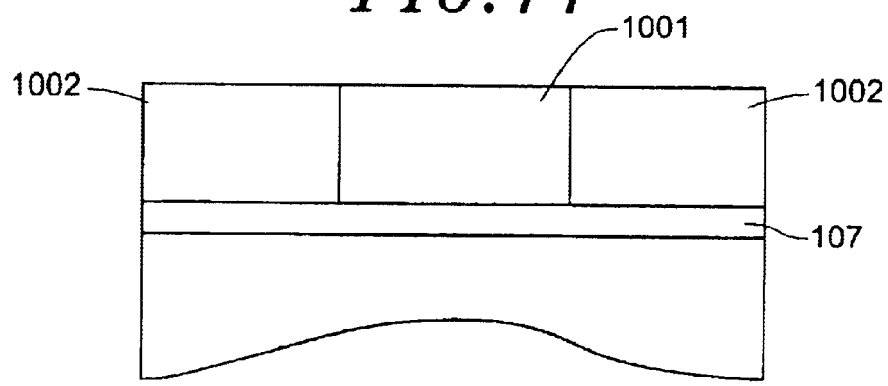
Figure 12:
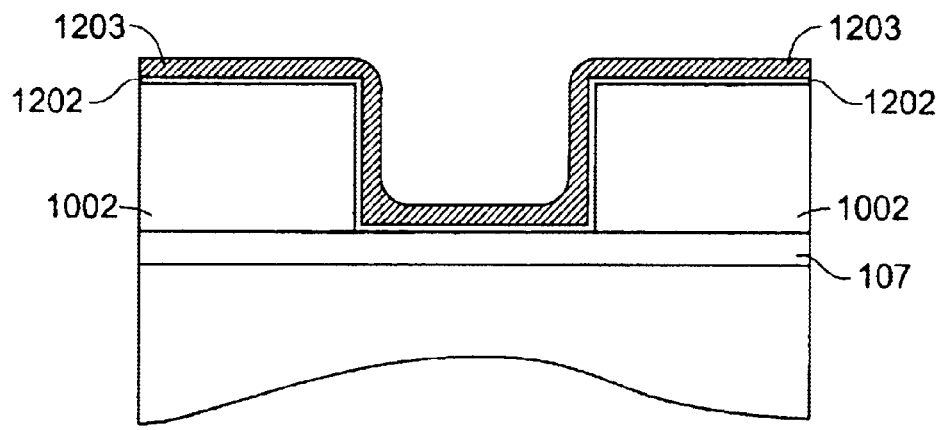
Figure 13:
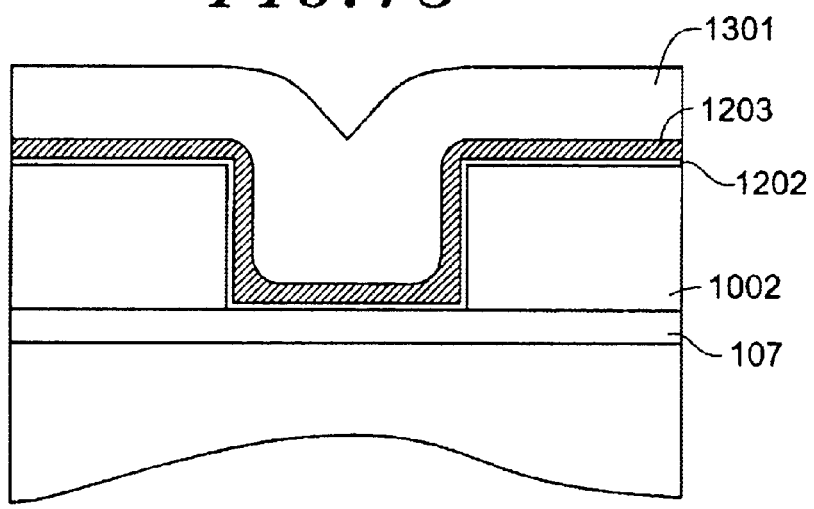

Another embodiment of the present invention is illustrated schematically in FIGS. 10–14. In FIG. 10, a dummy emitter 1001, in one embodiment silicon nitride (or the like), is formed on cap layer 107. Next, a silicon dioxide mask layer 1002 is formed overlying the surface of the structure. A chemical mechanical planarization (CMP) process or spin-on film (photoresist) and etch-back planarization process follows formation of oxide mask layer 1002 to reveal the surface of dummy emitter 1001, as illustrated in FIG. 11. Dummy emitter 1001 is then removed using, for example, a selective etch process. In FIG. 12, after removal of dummy emitter 1001, the contact system described above is formed. First, a thin reactive layer 1202 is deposited in accordance with the above-described process. Preferably, reactive layer 1202 comprises nickel and has a thickness in the range of about 10 to about 500 angstroms, preferably about 20 to about 100 angstroms. Next, a refractory layer 1203 is deposited in accordance with the above-described process. Preferably, refractory layer 1203 comprises titanium and has a thickness of at least about 100 angstroms, and preferably about 800 angstroms. In one embodiment, addition of an adhesive element to the nickel, such as, for example, titanium, silicon, chromium, and others known in the art, is preferred such that an alloy material consisting mostly of nickel and some in other adhesive element improves adhesive of layer 1202 to silicon dioxide mask layer 1002. Preferably, if present, the adhesive element comprises from about 5 to about 45 atomic percent of the reactive layer material.

Figure 14:
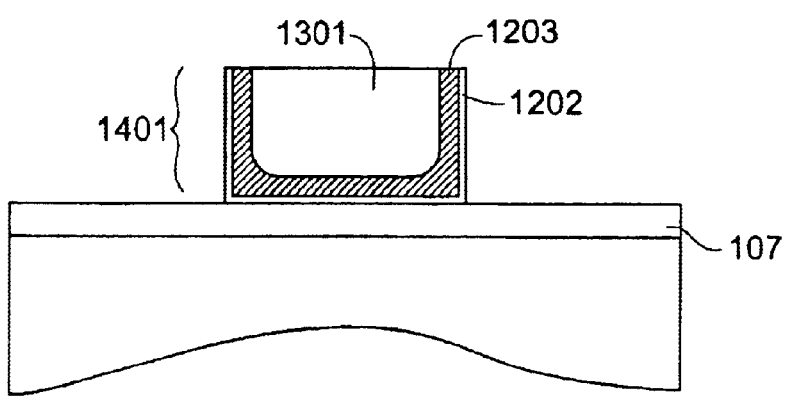

A low sheet resistance layer 1301 is formed overlying refractory layer 1203 in accordance with the above-described process. The contact structure is then subjected to a chemical mechanical planarization process, or other similar process known in the art, to remove any excess contact metals as illustrated in FIG. 14. Finally, the remaining dielectric material is removed using, for example, a wet or dry etch process, leaving contact structure 1401 intact.

Those skilled in the art will appreciate that there has been provided a method of forming contacts on compound semiconductor-based HBTs that minimizes contact resistance, prevents punchthrough of reactive contact metallization, reduces raw material costs by eliminating and/or minimizing the use of precious metals, such as gold and platinum, and facilitates manufacturing by reducing the number of metallization layers in the contact structure, without sacrificing device performance and functionality. In particular, there has been provided herein a suitable ohmic contact to an epitaxially grown, low bandgap compound semiconductor material, such as epitaxially grown, highly N-type doped indium gallium arsenide, that exhibits low sheet resistance and that excludes reactive metal overlayers that have proven detrimental to the reliability and manufacturability of HBT devices of the prior art.

While the present invention has been described with reference to specific embodiments thereof, it will be understood by those skilled in the art that various changes may be made without departing from the true spirit and scope of the invention. For example, processes similar to those described in the preferred embodiment, but differing by, for example, the sequence and/or number of process steps, may be utilized in the manufacture of devices in accordance with the present invention. Likewise, a variety of different materials may be utilized that are suitable for use in connection with the present invention. And as stated above, the present invention is not limited to the manufacture of HBTs; rather, specific embodiments of the present invention may be useful in the design and manufacture of a wide range of semiconductor devices, including, for example, N+contacts to laser diodes, light emitting diodes (LEDs), Schottky diodes, field effect transistors (FETs), metal-semiconductor field effect transistors (MESFETs), metal-oxide-semiconductor field effect transistors (MOSFETs), high electron mobility transistors (HEMTs), and other compound semiconductor and optoelectronic devices. Of course, many modifications may be made to adapt the invention to other contexts and applications without departing from its essential teachings.

We claim:

1. A method for forming an ohmic contact on a compound semiconductor layer of a semiconductor device comprising:
   depositing a reactive layer on at least a portion of a compound semiconductor layer of a semiconductor device, wherein the reactive layer is nickel and an adhesive element;
   depositing a refractory layer on said reactive layer, said refractory layer consisting essentially of titanium; and
   wherein additional layers of conductive metal are not deposited on the refractory layer in the forming of the ohmic contact.

2. The method according to claim 1 wherein said adhesive element is chosen from at least one of chromium, titanium, and silicon.

3. The method according to claim 1 wherein said refractory layer has a thickness of about 800 angstroms.

4. The method according to claim 1 wherein said step of depositing a reactive layer comprises depositing a reactive layer on at least a portion of a compound semiconductor layer that comprises $In_xGa_{1-x}As$, InAs, $In_xGa_{1-x}P$, InP, $In_xAl_{1-x}As$, InGaAsP, GaSb, or $In_xGa_{1-x}Sb$, all wherein $0<x<1$.

5. The method according to claim 1 wherein said step of depositing a reactive layer comprises depositing a reactive layer on at least a portion of a compound semiconductor layer that comprises $In_xGa_{1-x}As$, wherein $0.05<x<1.00$.

6. The method according to claim 1 wherein said step of depositing a reactive layer comprises depositing a reactive layer on at least a portion of a compound semiconductor layer that comprises $In_xGa_{1-x}As$, wherein $0.3<x<0.8$.

7. The method according to claim 1 wherein said step of depositing a reactive layer comprises depositing a reactive layer on at least a portion of a compound semiconductor layer that comprises $In_xGa_{1-x}As$, wherein x is approximately 0.6.

8. The method according to claim 1 wherein said step of depositing a reactive layer comprises depositing a reactive layer on at least a portion of a compound semiconductor layer that comprises InAs.

9. The method according to claim 1 wherein said step of depositing a reactive layer comprises depositing a reactive layer comprising from about 5 to about 45 atomic percent of the adhesive element.

10. The method of claim 1, further comprising:
    depositing a dielectric layer onto the refractory layer.

11. The method of claim 10, further comprising:
    depositing a nitride liner onto a portion of the dielectric layer.

12. The method of claim 11, further comprising:
    depositing a spacer onto a portion of the nitride liner.

13. The method of claim 1, wherein the compound semiconductor layer is N+InGaAs.

14. The method according to claim 1, wherein said refractory layer is entirely free of gold.

15. An ohmic contact to a compound semiconductor layer of a semiconductor device having a refractory layer disposed on a reactive layer and a reactive layer disposed on a semiconductor layer, the ohmic contact made by a method comprising:
    depositing the reactive layer on at least a portion of the compound semiconductor layer of the semiconductor device, wherein the reactive layer is nickel and an adhesive element;
    depositing the refractory layer on said reactive layer, said refractory layer consisting essentially of titanium, and
    wherein additional layers of conductive metal are not deposited on the refractory layer in the forming of the ohmic contact.

16. An ohmic contact to a compound semiconductor layer of a semiconductor device made by a method comprising:
    depositing a reactive layer on at least a portion of a compound semiconductor layer of a semiconductor device, wherein the reactive layer is nickel and an adhesive element;

depositing a refractory layer on said reactive layer, said refractory layer consisting essentially of titanium, and wherein additional layers of conductive metal are not deposited on the refractory layer in the forming of the ohmic contact, and wherein the semiconductor device comprises a laser diode, a light emitting diode, a Schottky diode, a field effect transistor, a metal-semiconductor field effect transistor, a metal-oxide-semiconductor field effect transistor, or a high electron mobility transistor.

17. An ohmic contact to a compound semiconductor layer of a semiconductor device made by a method comprising:

depositing a reactive layer on at least a portion of a compound semiconductor layer of a semiconductor device, wherein the reactive layer is nickel and an adhesive element:

depositing a refractory layer on said reactive layer, said refractory layer consisting essentially of titanium; and disposing a dielectric layer upon the refractory layer, wherein additional layers of conductive metal are not deposited on the refractory layer in the forming of the ohmic contact.

18. The ohmic contact of claim 17, wherein the method further comprises:

disposing a nitride liner onto a portion of the dielectric layer.

19. The ohmic contact of claim 18, wherein the method further comprises:

disposing a spacer onto a portion of the nitride liner.

20. An ohmic contact to a compound semiconductor layer of a semiconductor device made by a method comprising:

depositing a reactive layer on at least a portion of a compound semiconductor layer of a semiconductor device, wherein the reactive layer is nickel and an adhesive element:

depositing a refractory layer on said reactive layer, said refractory layer consisting essentially of titanium, and wherein said refractory layer is entirely free of gold; and wherein additional layers of conductive metal are not deposited on the refractory layer in the forming of the ohmic contact.

\* \* \* \* \*